United States Patent
Maruyama et al.

(10) Patent No.: US 6,951,048 B2
(45) Date of Patent: *Oct. 4, 2005

(54) METHOD FOR PRODUCING A STACKED PIEZOELECTRIC ELEMENT

(75) Inventors: Yutaka Maruyama, Tokyo (JP); Nobuyuki Kojima, Kanagawa-ken (JP); Toru Ezaki, Tokyo (JP); Takahiro Yamakawa, Saitama-ken (JP)

(73) Assignees: Canon Kabushiki Kaisha, Tokyo (JP); Taiheiyo Cement Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/700,852

(22) Filed: Nov. 5, 2003

(65) Prior Publication Data

US 2004/0088842 A1 May 13, 2004

Related U.S. Application Data

(62) Division of application No. 09/597,727, filed on Jun. 19, 2000, now Pat. No. 6,668,437, which is a division of application No. 09/251,494, filed on Feb. 17, 1999, now Pat. No. 6,291,932.

(30) Foreign Application Priority Data

| Feb. 17, 1998 | (JP) | 10-034981 |
| Mar. 13, 1998 | (JP) | 10-063210 |
| Mar. 13, 1998 | (JP) | 10-063211 |

(51) Int. Cl.[7] .................. H04R 17/00; H01L 41/04
(52) U.S. Cl. .................. 29/25.35; 29/830; 29/846; 29/852; 310/366
(58) Field of Search .................. 29/25.35, 830, 29/852, 846; 310/364, 332, 323.01, 366, 328, 363, 311, 323.06

(56) References Cited

U.S. PATENT DOCUMENTS

| 4,742,264 A | 5/1988 | Ogawa .................. 310/332 |
| 5,245,734 A | 9/1993 | Issartel .................. 291/25.35 |
| 5,639,508 A | 6/1997 | Okawa et al. .......... 29/25.35 |
| 5,669,127 A | 9/1997 | Takahashi et al. ...... 298/25.35 |
| 5,814,919 A | 9/1998 | Okumura ............... 310/323.12 |
| 5,820,771 A | 10/1998 | Burke et al. .................. 216/27 |
| 5,925,262 A | 7/1999 | Choi et al. .................. 216/24 |
| 5,936,327 A | 8/1999 | Takahashi et al. ....... 310/323 |
| 6,046,526 A | 4/2000 | Maruyama ............ 310/323.01 |
| 6,114,798 A | 9/2000 | Maruyama et al. .... 310/323.06 |
| 6,191,520 B1 | 2/2001 | Maruyama et al. .... 310/323.06 |
| 6,291,932 B1 | 9/2001 | Maruyama et al. ........ 310/366 |

FOREIGN PATENT DOCUMENTS

| JP | 8-213664 | 8/1996 |

*Primary Examiner*—Marc Jimenez
*Assistant Examiner*—Tai Van Nguyen
(74) *Attorney, Agent, or Firm*—Fitzpatrick, Cella, Harper & Scinto

(57) ABSTRACT

A method for producing a stacked piezoelectric element by alternately stacking a plurality of layers of an electrode material and piezoelectric layers having an electromechanical energy converting function and provided with penetrating electrodes, which are obtained by forming through holes in each piezoelectric layer and filling such through holes with the electrode material, to be connected at a contact portion with a layer of the electrode material and sintering the thus stacked layers, includes a step of forming, on a first layer of the electrode material, a second layer of electrode material by printing at a peripheral area of the contact portion between the first layer of the electrode material and the penetrating electrodes.

4 Claims, 9 Drawing Sheets

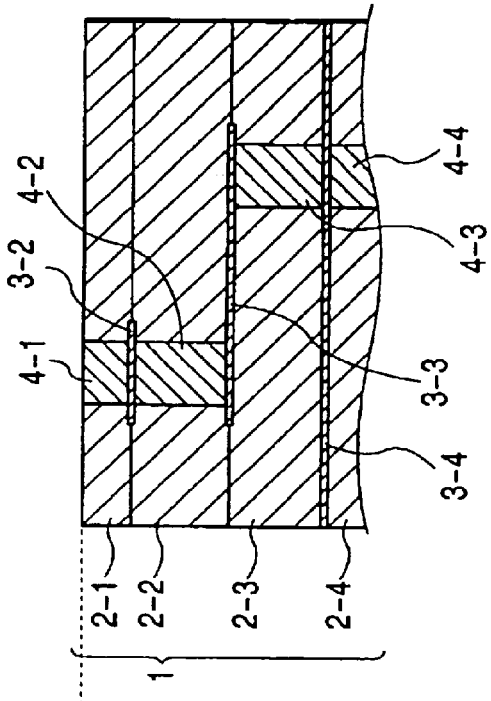
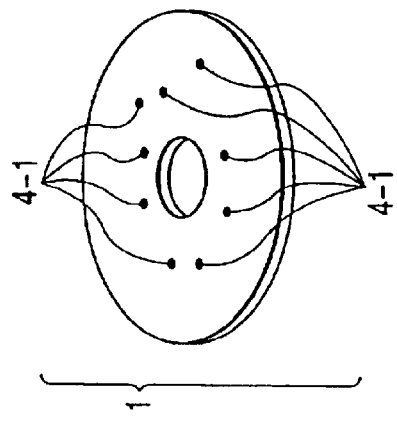
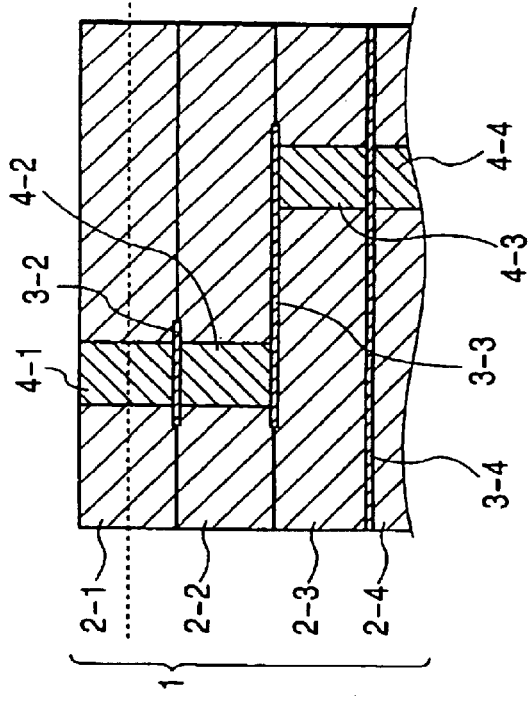

FIG. 3

|   |   | UNIT | SAMPLE A | SAMPLE B | SAMPLE C |
|---|---|---|---|---|---|
| 1 | FIRST LAYER | mm | 0.087 | 0.085 | 0.089 |
| 2 | NUMBER OF LAYERS |  | 7 | 7 | 7 |
| 3 | TOTAL THICKNESS | mm | 0.609 | 0.595 | 0.623 |
| 4 | THICKNESS AFTER PROCESSING | mm | 0.5 | 0.5 | 0.5 |
| 5 | LAPPED AMOUNT FOR ONE SURFACE | mm | 0.0545 | 0.0475 | 0.0615 |

FIG. 4

|   |   | UNIT | SAMPLE A | SAMPLE B | SAMPLE C |
|---|---|---|---|---|---|
| 1 | FIRST LAYER | mm | 0.087 | 0.085 | 0.089 |
| 2 | NUMBER OF LAYERS |  | 27 | 27 | 27 |
| 3 | TOTAL THICKNESS | mm | 2.349 | 2.295 | 2.403 |
| 4 | THICKNESS AFTER PROCESSING | mm | 2.2 | 2.2 | 2.2 |
| 5 | LAPPED AMOUNT FOR ONE SURFACE | mm | 0.0745 | 0.0475 | 0.1015 |

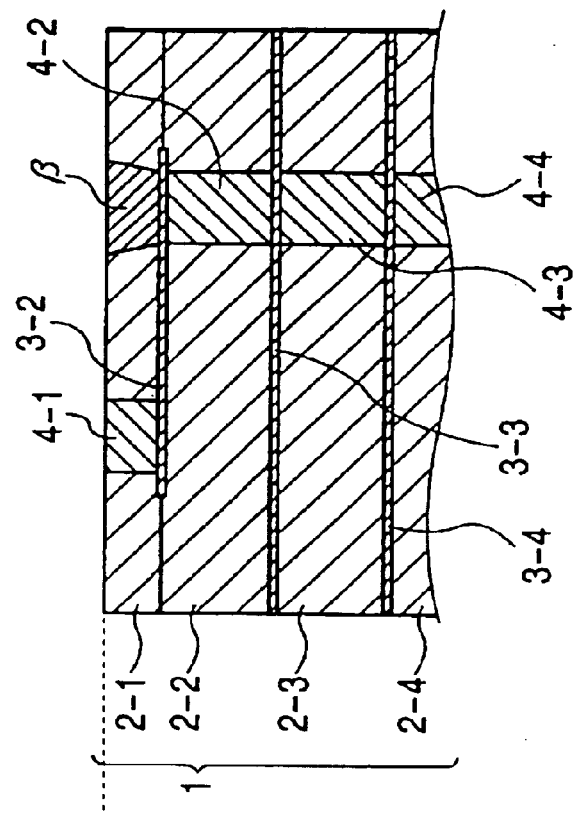
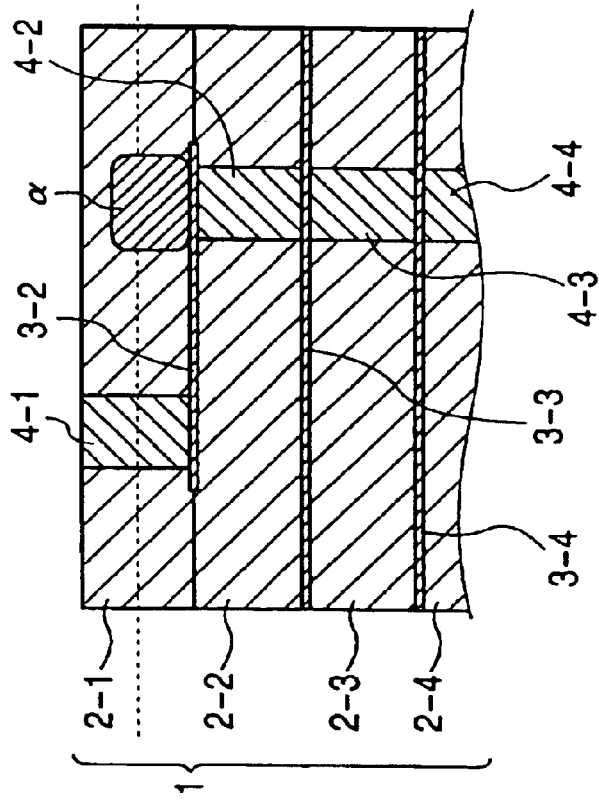

FIG. 8
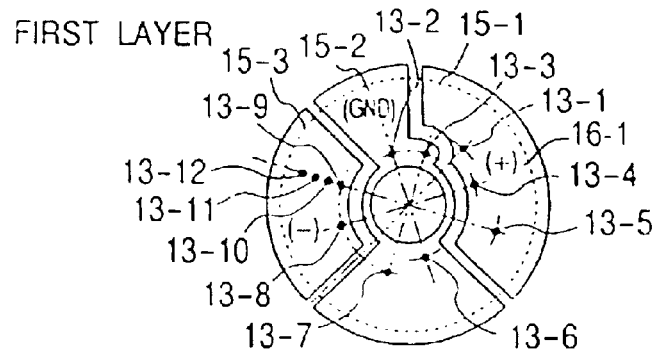
FIRST LAYER
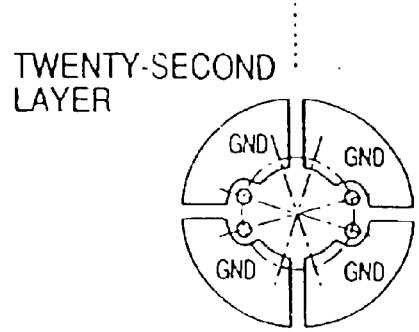
TWENTY-SECOND LAYER
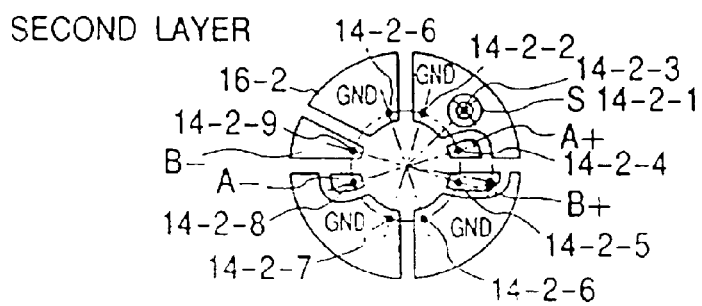
SECOND LAYER
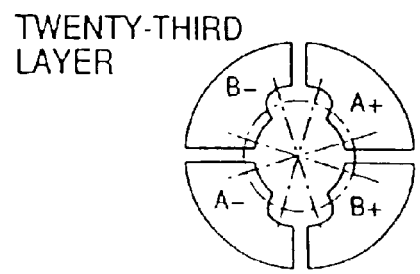
TWENTY-THIRD LAYER
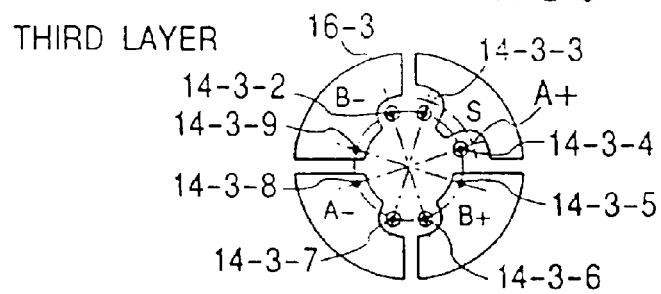
THIRD LAYER
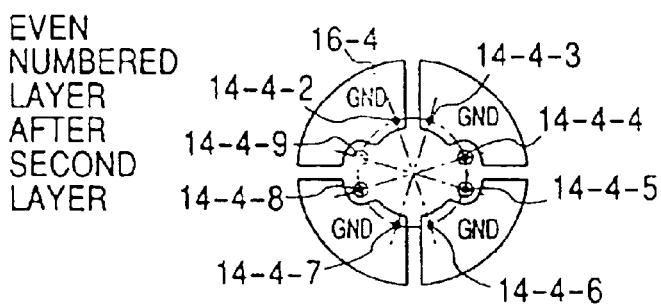
EVEN NUMBERED LAYER AFTER SECOND LAYER
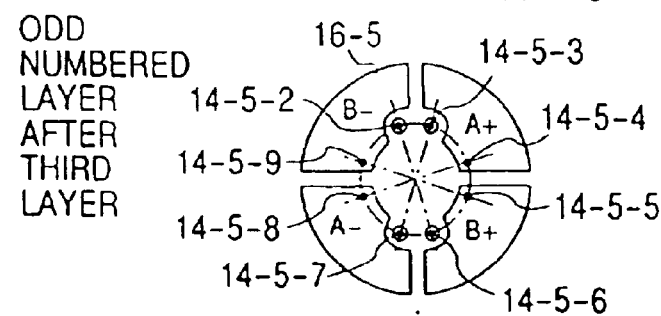
ODD NUMBERED LAYER AFTER THIRD LAYER FIG. 12A
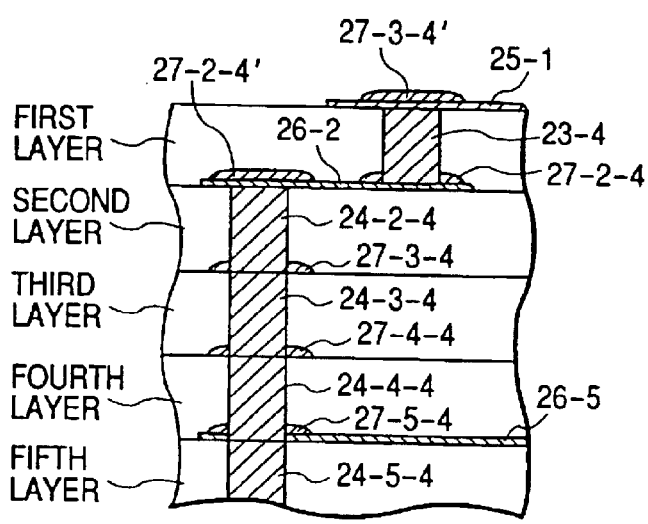
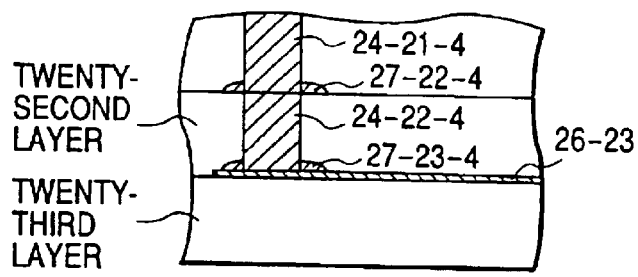
FIG. 12B
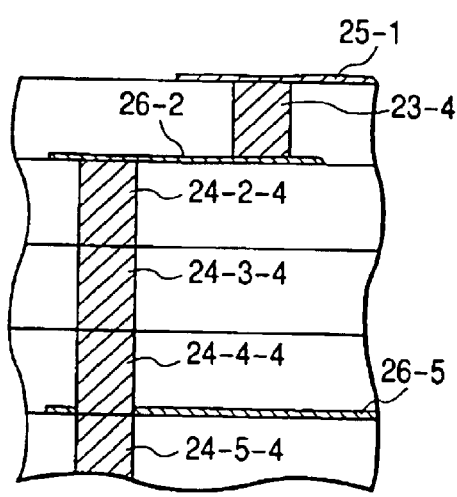
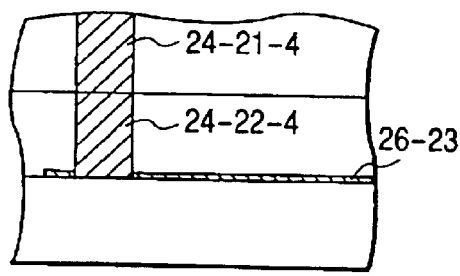

METHOD FOR PRODUCING A STACKED PIEZOELECTRIC ELEMENT

This is a divisional application of application Ser. No. 09/597,727, filed on Jun. 19, 2000 U.S. Pat. No. 6,668,437, which is a divisional of application Ser. No. 09/251,494, filed on Feb. 17, 1999, now U.S. Pat. No. 6,291,932, issued on Sep. 18, 2001.

BACKGROUND OF THE INVENTION

1. Field of the Invention

The present invention relates to a stacked piezoelectric element and a producing method therefor.

2. Related Background Art

Conventionally there has been proposed a stacked piezoelectric element in which an electro-mechanical energy converting material such as piezoelectric ceramics having electro-mechanical energy converting function and an electrode material are alternately stacked. Such stacked piezoelectric element, in comparison for example with plate like single piezoelectric ceramics of a same thickness, can provide a larger distortion for deforming or a larger generated force with a lower applied voltage, and is therefore investigated and employed for use in the driving portion of a vibration element constituting a vibration driving device such as a piezoelectric actuator or a vibration wave motor.

The stacked piezoelectric element is produced principally in the following two methods.

The first producing method consists of forming electrode layers on both surfaces of a sintered single piezoelectric ceramic plate, stacking a plurality of such ceramic plate and adhering, for example with adhesive material, the ceramic plates.

The second producing method is an integral sintering method consisting of superposing and thermally pressing layers of unsintered sheet-shaped molded member (green sheet) containing piezoelectric ceramics and an organic binder and unsintered layers of electrode paste and sintering thus superposed layers.

For connecting the electrode layers in thus produced stacked piezoelectric element with the outside, there is proposed a method of forming electric connection between the layers by a through hole (via hole) electrode, which is a penetrating electrode obtained by forming a through hole in each piezoelectric ceramic layer and filling such through hole with an electrode material.

Particularly in the second producing method for the stacked piezoelectric element, the through hole (via hole) electrode is obtained by forming a hole in the green sheet of the piezoelectric ceramics and filling the holes with conductive paste before stacking, and then sintering the green sheets after stacking.

A stacked piezoelectric element, in which such through hole (via hole) electrode is exposed on the surface layer of the stacked piezoelectric element and is used as the electric conductive means to the external circuit such as a printed wiring board, is proposed for example in the Japanese Patent Application Laid-open No. 8-213664.

When such proposed stacked piezoelectric element is employed in rod or Langevin type of a vibration wave actuator or motor, the reference shows that the smoothness of the upper and lower surfaces of the element affects the mechanical quality coefficient (Qm) of the entire device.

It is therefore proposed to apply surface processing (lapping, polishing, grinding etc.) to the upper and lower surfaces of the stacked piezoelectric element after sintering, thereby obtaining the element of high flatness.

The through hole (via hole) electrode of the stacked piezoelectric element may be provided at a position arbitrarily selected for forming electrical conduction between the layers.

For example in FIG. 6A, in a piezoelectric ceramic 2-1 of a first layer, constituting the surface layer of the stacked piezoelectric element 1, a through hole electrode 4-1 is formed in a position suitable for external connection.

In a piezoelectric ceramic 2-2 of a second layer, a through hole electrode 4-2 is provided in a position suitable for connecting the piezoelectric ceramic 2-1 of the first layer to a piezoelectric element 2-3 of a third layer so as to be made an electrical connection by an electrode film 3-2.

In the third and lower layers, a through hole electrode 4-3 and further through hole electrodes are provided in positions having relatively little contribution to the mechanical force generation, in order to achieve effective force generation of the stacked piezoelectric element 1.

However, the surface processing on the upper and lower surfaces of the stacked piezoelectric element of the above-described configuration has revealed the necessity for further improvement as will be explained in the following.

In the piezoelectric ceramics 2 constituting the stacked piezoelectric element 1 and the conductive member constituting the through hole electrodes 4 for the different layers, the green sheet and the conductive paste containing the conductive material show mutually different contraction rates at the sintering operation, because of the characteristics of each material and the different mixing ratios of the organic binder present prior to the sintering.

For this reason, there is generated a residual stress in a hatched area a shown in FIG. 6A. A defect from the falling off is easily generated in such area α, and it is confirmed that, if the smoothing surface processing is applied to the upper and lower surfaces of such stacked piezoelectric element 1, a part of the piezoelectric ceramic drops off in an area β shown in FIG. 6B.

Such dropping off of the piezoelectric ceramic exposes the through hole electrode 4-2, leading to a drawback such as shortcircuiting with the wiring on the printing wiring board.

On the other hand, the electrode material employed in the above-described process is generally composed of a precious metal (platinum, palladium, silver etc.) having high melting temperature or a mixture thereof because it has to be sintered together with the piezoelectric ceramic material. The electrode material is most commonly composed of a mixture of silver and palladium with a weight ratio of 5:5 to 8:2 though it is dependent also on the sintering temperature of the piezoelectric ceramic.

Such precious metals are expensive and constitute the largest proportion in the material cost of the stacked piezoelectric element. For this reason, the electrode layers are formed as thin as possible within the manufacturable range of the stacked piezoelectric element and within the acceptable performance range thereof, by the improvement in the electrode paste consisting of the electrode material, organic binder, solvent and other additives and the layer forming method such as screen printing.

The piezoelectric element thus formed is then subjected to a polarization process for enabling elongation and contraction for the actual use. The uppermost surface electrode layer is used as a contact electrode in such polarization process but is removed after the polarization process, thereby enabling connection of the individual through hole (through hole filled with conductive material being often called a through hole electrode or a via hole) exposed on the surface with the driving circuit.

Prior to the actual use, the stacked piezoelectric element is subjected to the polarization process of applying a voltage to the piezoelectric ceramic layers. This process is executed by applying a voltage of 3 to 1 kV/mm for a period of 30 to 60 minutes under a high temperature (80° C. to 200° C.).

In this process, the current generated after the voltage application becomes very large in case of the stacked piezoelectric element because of the significantly larger electrostatic capacitance in comparison with the conventional single-plate piezoelectric element. Consequently a large current is generated in the thin electrode layers of the stacked piezoelectric element, particularly in the connecting portion between the surface electrode layer in direct contact with the DC power source for the polarization process and the conductive electrode connecting the surface electrode to the internal electrode layers, whereby sparks are often generated to induce fused breakage of the connecting portion, thus inhibiting the polarization process or eventually resulting in the destruction of the element by the shock of the sparks.

The stacked piezoelectric element utilizes, in the conductive electrode for connecting the internal electrode layers, the through hole commonly employed in the printed circuit board, and has an internal electrode layer (to be explained later) having a circuit wiring function in addition to the surface electrode layer in direct contact with the DC power source. Such wiring electrode layer also causes sparks or fused breakage at the connecting portion with the conductive electrode, leading to the destruction of the device.

FIGS. 13A and 13B illustrate a stacked piezoelectric element described in the Japanese Patent Application Laid-open No. 8-213664. The stacked piezoelectric element 11 in FIG. 13A is composed, as shown in FIG. 13B, of n piezoelectric layers (piezoelectric ceramic layers) 14 (14-1 to 14-n). In the stacked piezoelectric element 11, the second and subsequent piezoelectric layers (14-2 to 14-n) are respectively provided with electrode layers 13 (13-2 to 13-n) for example of 4-divided configuration, and the electrode layers requiring mutual conduction are connected by through holes 12 penetrating through the piezoelectric layer.

More specifically, each of the first to (n−1)th piezoelectric layers 14-1 to 14-(n−1) is provided with eight through holes, and the first through hole 12-1-1 of the first piezoelectric layer 14-1 is connected to the first electrode 13-2-1 of the second electrode layer while the third through hole 12-1-3 of the first piezoelectric layer 14-1 is connected to the third through hole 12-2-3 formed in the second piezoelectric layer 14-2 and to the second electrode of the third electrode layer on the third piezoelectric layer 14-3.

Subsequently the first through hole formed in each piezoelectric layer is similarly connected to every even numbered layers, to the through hole 12-(n−2) of the third piezoelectric layer from the bottom and to the first electrode layer 13-(n−1)-1 on the second piezoelectric layer 14-(n−1) from the bottom. The third through hole in the third and subsequent piezoelectric layers is connected similarly to every odd numbered layers, and to the second electrode formed on the lowermost piezoelectric layer 14-n.

SUMMARY OF THE INVENTION

One aspect of the invention is to provide a stacked piezoelectric element in which a plurality of piezoelectric layers and electrode layers are alternately stacked and thus stacked electrode layers are connected by a penetrating electrode formed in a conductive hole provided across the piezoelectric layer, wherein the penetrating electrode formed in the second piezoelectric layer is so positioned as to overlap with that formed in the first piezoelectric layer in the direction across the piezoelectric layer, thereby improving the reliability.

One aspect of the invention is to provide a stacked piezoelectric element in which the surface electrode layer utilized in the polarization process is made thicker than the internal electrode layers, thereby reducing defects caused in the polarization process and improving the production yield.

One aspect of the invention is to provide a stacked piezoelectric element in which, in the junction portion between the through hole and the electrode material layer, there is provided a reinforcing electrode material layer for increasing the thickness of the electrode material layer larger in the peripheral portion of the through hole than in other portions, thereby reducing the defects caused in the polarization process and increasing the production yield.

Other objects of the present invention, and the features thereof, will become fully apparent from the following detailed description.

BRIEF DESCRIPTION OF THE DRAWINGS

FIG. 1 is a perspective view of a stacked piezoelectric element constituting a first embodiment of the present invention;

FIGS. 2A and 2B are cross-sectional views of the stacked piezoelectric element of the first embodiment of the present invention;

FIG. 3 is a table showing the thickness of the stacked piezoelectric element of the first embodiment of the present invention;

FIG. 4 is a table showing the thickness of the stacked piezoelectric element of a second embodiment of the present invention;

FIGS. 6A and 6B are cross-sectional views of a conventional stacked piezoelectric element;

FIG. 8 is a plan view of the layers constituting the stacked piezoelectric element shown in FIG. 7;

FIGS. 12A and 12B are partial lateral cross-sectional views of the stacked piezoelectric element, respectively in the fifth embodiment in a conventional configuration.

DETAILED DESCRIPTION OF THE PREFERRED EMBODIMENTS

Figure 5B:
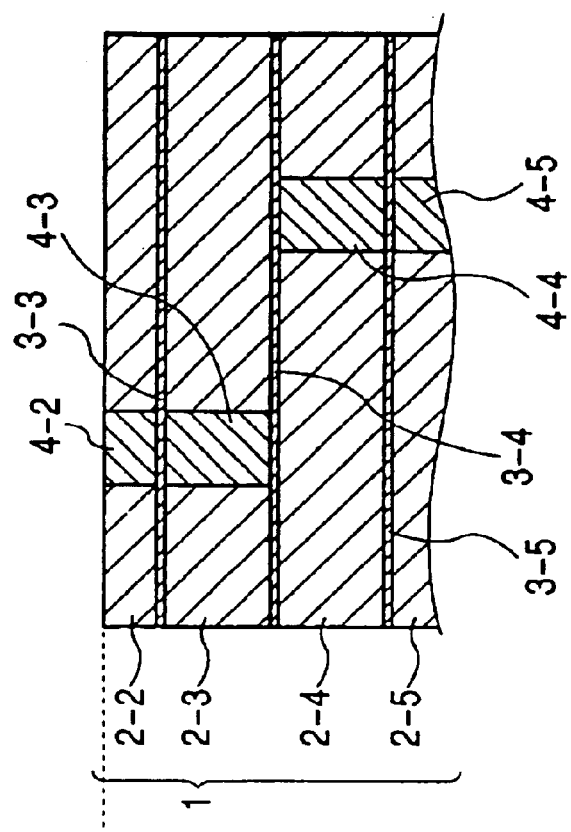
FIGS. 5A and 5B are cross-sectional views of the stacked piezoelectric element of the second embodiment of the present invention.

First Embodiment.

FIGS. 1, 2A, 2B and 3 illustrate a first embodiment of the present invention.

FIG. 1 is an external view of the stacked piezoelectric element of the present embodiment, and FIGS. 2A and 2B are cross-sectional views thereof.

In the present embodiment, the green sheet is prepared, in consideration of the shrinkage in the sintering, in such a manner that the thickness after sintering becomes for example 0.087 mm. In the actual manufacturing process, it is confirmed that the thickness of the green sheet after sintering shows a variation of ±0.002 mm though the range of variation is dependent on the manufacturing process to a certain extent.

The above-mentioned green sheet is subjected to the formation of through hole electrodes 4 (numbered as 4-1 in the surface layer, as 4-2 in the second layer thereunder and 4-3 in the third layer), an electrode film 3 (that on the first layer being used as the contact terminal for the polarization process of the stacked piezoelectric element but being removed thereafter, that on the second layer being numbered as 3-2, that on the third layer as 3-3 and that on the fourth layer as 3-4) etc., then press formed, cut into a desired shape and sintered.

In the present embodiment, there are employed 7 layers.

After processing, the stacked piezoelectric element has a dimension for example with an outer diameter of 10 mm, an inner diameter of 4 mm and a thickness of 0.5 mm.

The outer diameter after sintering is selected as about 11 mm in consideration of the dimension after processing, and is finished as 10 mm by grinding.

FIGS. 2A and 2B show the cross section in the surface portion in the radial direction (center at the right hand side in figure) of the through hole electrode (via hole) of the stacked piezoelectric element 1, respectively before and after the lapping of the both surfaces.

In the present embodiment, as shown in FIGS. 2A and 2B, the through hole electrode 4-2 of the second layer is so positioned as to be projected, in the axial direction, in the same position as the through hole electrode 4-1 of the first layer (namely so as to mutually overlap in the axial direction).

The through hole electrodes 4-3 etc. of the third and subsequent layers are not particularly limited in the present invention.

The thickness after sintering varies by the bending in the sintering, variation in the shrinkage rate, variation in the thickness of the green sheet etc.

In the present embodiment, lapping on both surfaces is executed after the polarization process as shown in FIG. 2B, in order to correct the variation in the thickness and to secure the smoothness of the upper and lower surfaces.

The thicknesses before and after the lapping of the both surfaces of the stacked piezoelectric element 1 are shown in FIG. 3.

In order to secure the smoothness and to obtain a constant thickness, there is required a processing allowance shown in FIG. 3. In case the first layer is formed with a thickness of 0.089 mm as in a sample C of a piezoelectric element shown in FIG. 3, the thickness from the upper surface of the element to the interface between the first and second layers becomes 0.0275 mm which is significantly smaller than in samples A and B.

In the present embodiment, the through hole electrode 4-2 of the second layer is so positioned as to be projected in the same position as the through hole electrode 4-1 of the first layer, so that the residual stress present in the layers on the through hole electrode 4-3 of the third layer can be dispersed and there can be provided a stacked piezoelectric element of excellent reliability without dropping of the piezoelectric ceramic resulting from the difference in the shrinkage rate between the green sheet and the conductive paste.

Second Embodiment.

Figure 5A:
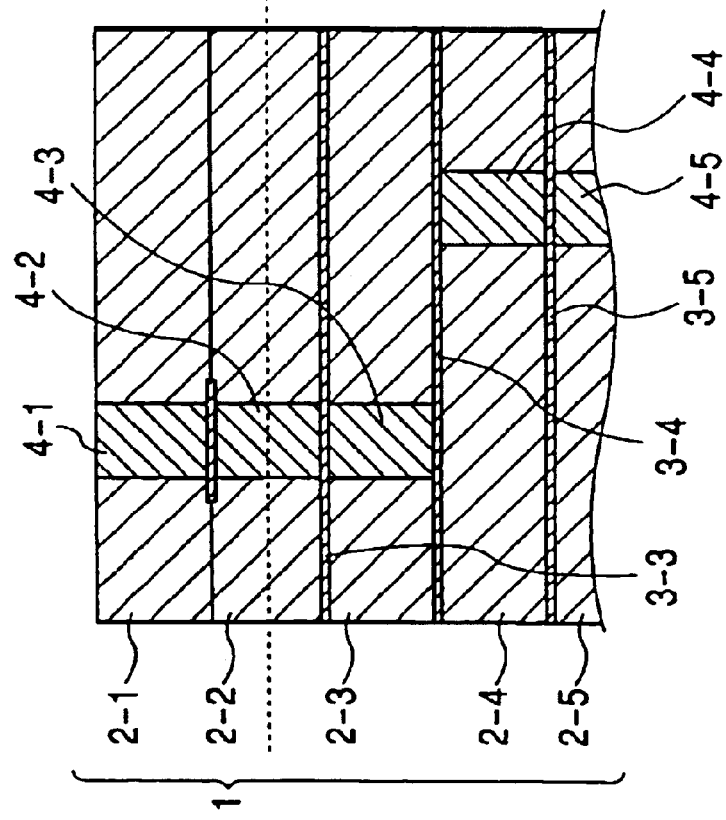

FIGS. 4, 5A and 5B illustrate a second embodiment.

The outer and inner diameters in the present embodiment are same as those in the first embodiment and will not be explained further. The variation in the thickness of the green sheet is also same as in the first embodiment. In the present embodiment, there are employed 27 stacked layers.

The electrode film 3 and the through hole electrodes 4 formed in each layer are schematically shown in FIGS. 5A and 5B.

FIGS. 5A and 5B respectively show states before and after the lapping of the two surfaces. As shown in FIG. 5A, the through hole electrode 4-2 of the second layer is so as to be projected, in the axial direction, in the same position (namely so as to overlap) as the through hole electrode 4-1 of the first layer.

The through hole electrode 4-3 of the third layer is so formed as to be in the same position, in the projection, as the through hole electrode 4-2 of the second layer, and is therefore in the same position, in the projection, as the through hole electrode 4-1 of the first layer.

The thickness before and after the lapping of the both surfaces of the stacked piezoelectric element of the present embodiment are shown in FIG. 4.

As the stacked piezoelectric element of the present embodiment has 27 stacked layers with a large variation of thickness after sintering, there may be required a lapping allowance (on one surface) as large as 0.1 mm as in a sample C shown in FIG. 4. As this lapping allowance is larger than the thickness 0.089 mm of the first layer, the surface after processing is constituted by the second piezoelectric ceramic layer 2-2 at the sintering as shown in FIG. 5B.

In the present embodiment, the through hole electrode 4-3 formed in the third layer is provided, in the projection, in the same position as the through hole electrode 4-2 of the second layer, so that there can be prevented the dropping of the piezoelectric ceramic of the second layer, resulting from the residual stress in the portion present under the through hole electrode 4-4 of the fourth layer.

In the first and second embodiments, similar effect can be obtained by lapping, polishing or grinding on one or both surfaces.

In the first and second embodiments, the through hole electrode (via hole), formed as a penetrating electrode in the conductive hole of the piezoelectric ceramics such as the surfacial piezoelectric member, overlaps with the through hole electrode (via hole) of the next layer in the direction across the layer. Therefore, even when the surface processing is applied to the surface of the first layer or executed down to the surface of the second layer, there can be prevented the partial dropping defect resulting, in a position opposed to the through hole electrode, from the difference in the shrinkage rate between the piezoelectric ceramics and the electrode and there can be obtained a stacked piezoelectric element with improved reliability.

Third Embodiment.

Figure 7:
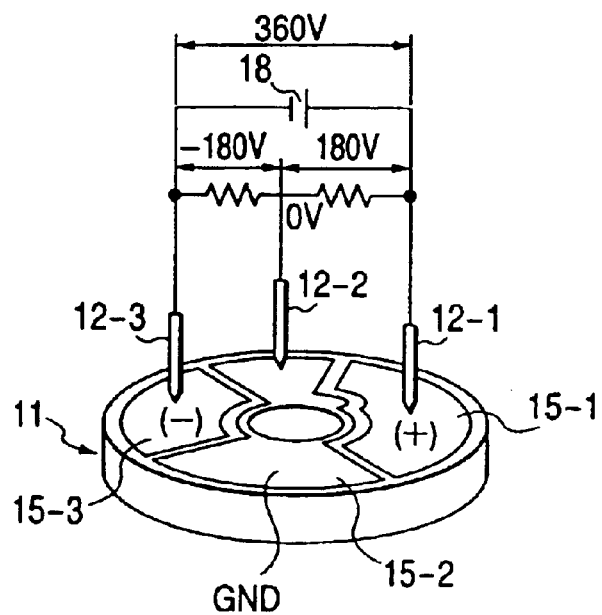
FIG. 7 is a perspective view of a stacked piezoelectric element constituting a third embodiment of the present invention.

FIGS. 7 and 8 illustrate a third embodiment of the present invention.

FIG. 7 is an external view of the stacked piezoelectric element 1 at the polarization process, and FIG. 8 illustrates the uppermost conductive electrodes or through holes 13 (13-1 to 13-12) connecting the surface electrode layer 15 (including electrode sections 15-1 to 15-3) of the first layer to the electrode layers 16-2 of the second layer and subsequent electrode layers (16-2 to), and the conductive electrodes 14 (14-2-1 to 9 . . . ) of the second and subsequent layers.

The stacked piezoelectric element of the present embodiment for example has an outer diameter of 10 mm, an inner diameter of 2.8 mm and a thickness of about 2 mm and includes a first electrode layer (diameter 9.5 mm) and second to twenty-second electrode layers (diameter 9 mm) which are formed by screen printing electrode paste on green sheets (not shown) of a thickness of 90 μm, consisting of powdered piezoelectric ceramics and an organic binder.

The through holes 13, 14 are obtained by forming a hole of about 0.1 mm in the green sheet and filling the hole with the electrode paste, in order to obtain electrical conduction between the electrode layers. The electrode paste contains silver and palladium in a weight ratio of 6:4. The green sheets and the electrode layers are precisely superposed, then mutually adhered by hot pressing, and then sintered with a maximum temperature of 1120° C., with shrinkage of about 20% at the sintering.

The through holes 13-2 to 13-9 are connected from the first to twenty-third electrode layers, while the through hole 13-1 is connected to the third layer (electrode layer S in the third layer being used for a signal outputting sensor), and the through holes 13-10 to 13-12 are used for recognizing the position of the present stacked piezoelectric element.

The electrode layers 15-1 to 15-3 of the first layer are surface layers directly receiving the voltage by the contact pins 12 from the polarizing DC power source as shown in FIG. 7. The polarization process was executed by employing a DC power source 18 in the configuration shown in FIG. 7 and applying a voltage of +180 V at the (+) side and −180 V at the (−) side with respect to the ground GND for 1 hour in silicone oil of 150° C.

In the present embodiment, the first electrode layer 15 is made thicker than other electrode layers 16.

The first to twenty-second electrode layers, containing expensive precious metals, have conventionally been formed as thin as possible, but the obtained thickness is more than 1 μm at minimum and is generally 2 to 3 μm in average, based on the currently available electrode paste and screen printing method.

If the polarization process is executed in this state under the above-described conditions, a current is abruptly generated immediately after the voltage application as in charging of a capacitor (the present stacked piezoelectric element has an electrostatic capacitance of 65 μF at (+) or (−) side), thereby easily causing sparks in the junctions between the through hole electrodes 13-2 to 13-9 and the electrode layers 15-1 to 15-3, eventually resulting in defective polarization caused by fused breakage or destruction of the element by the shock of the sparks, as explained in the foregoing.

Such defects have been almost removed when the thickness of the surface electrode layers 15-1 to 15-3 is increased to 4 to 6 μm in average by changing the printing screen.

Such effect becomes securer by further increasing the thickness of the surface electrode layer 15. It is presumed that the increase in the thickness of the surface electrode layer achieves securer conduction with the through hole surface and the reduced electrical resistance reduces the possibility of fused breakage by the sparks. However an excessive thickness is undesirable because of the increased cost.

The present embodiment employs the conductive electrode formed by the through hole, but a similar result based on the increased thickness of the electrode layer can also be obtained with a lateral face electrode, which is a conductive electrode formed on the lateral face of the device.

Fourth Embodiment.

In the present embodiment, the second electrode layer 16-2 shown in FIG. 8 as well as the first electrode layer 16-1 are made thicker than other electrode layers.

The second electrode layer 16-2 is an internal electrode layer with conductive circuit function, in which through holes 13-4, 14-2-4; 13-5, 14-2-5; 13-7, 14-2-7; 13-8, 14-2-8; and 13-9, 14-2-9 in five positions are connected to the through holes of the third layer through the second electrode layer.

Figure 9:
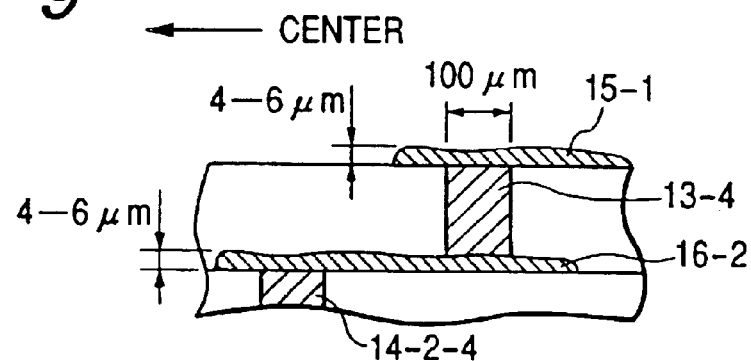
FIG. 9 is a partial lateral cross-sectional view of a stacked piezoelectric element constituting a fourth embodiment of the present invention.

FIG. 9 is a schematic cross-sectional view, in the radial direction, of the through holes 13-4 and 14-2-4. The through hole 13-4 connected to the electrode layer 15-1 used for polarization is connected to the through hole 14-2-4 through the electrode layer 16-2 of the second layer.

The increased thickness of the electrode layers reduces the electrical resistance in the joints between the through hole 13-4 and the electrode layer 15-1, between the through hole 13-4 and the electrode layer 16-2 and between the through hole 14-2-4 and the electrode layer 16-2, thereby achieving securer conduction and avoiding spark generation.

On the other hand, the through holes 13-2, 13-3 and 13-6 connected straight to the twenty-second layer. The through holes 13-1, 13-10 to 13-12 are same as explained before.

The thickness of the second electrode layer is also conventionally selected as 2 to 3 μm in average, but the current abruptly generated after the start of the polarization process tends to generate sparks, resulting frequently in defective polarization, crack formation on the surface of the first layer or destruction of the entire element. Such defects are almost eliminated by increasing the thickness of the second electrode layer to 4 to 6 μm in average.

However, with a further increased thickness of the electrode layer, the first electrode layer becomes easily peelable from the formed piezoelectric ceramic layer because the second layer is an internal electrode layer. It is presumed that the electrode layer is basically free from chemical reaction with the piezoelectric ceramic layer so that the peeling tends to occur when the electrode layer becomes thicker. For this reason, the thickness of the second circuit forming electrode layer is optimally within a range of 4 to 6 μm.

The second electrode layer need not necessarily be made thicker in the entire electrode layer but can be made thickness only in the areas of the through holes 13-4, 14-2-4; 13-5, 14-2-5; 13-7, 14-2-7; 13-8, 14-2-8; 13-9, 14-2-9. However, in consideration of the screen printing technology employed in the production, it is easier to increase the thickness of the second electrode film in the entire area thereof.

The above-described stacked piezoelectric element can be applied as the vibration generating source constituting a vibration member in a vibration driving device such as a vibration motor, in which a traveling wave is generated by the synthesis of bending vibration in two directions, but the application is not limited to such object. It can also be utilized as the vibration generating source for other purposes with an appropriate change in the configuration of the electrode layers. It is for example sufficiently applicable to a stacked piezoelectric transducer.

As explained in the foregoing, the third and fourth embodiments reduce the defects caused in the polarization process, thereby improving the production yield of the stacked piezoelectric element, and enable the polarization process within a shorter time, without particular change in the polarizing power source, voltage condition thereof, or method or means for voltage elevation.

Fifth Embodiment.

Figure 10:
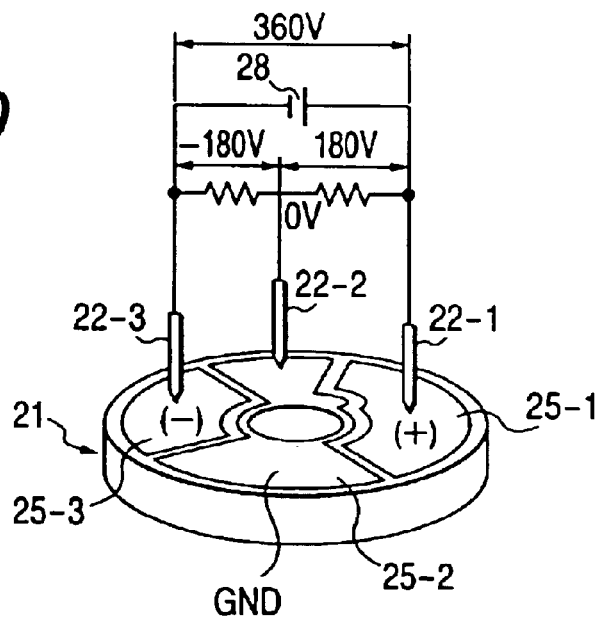
FIG. 10 is a perspective view of a fifth embodiment of the present invention in the polarization process.
Figure 11:
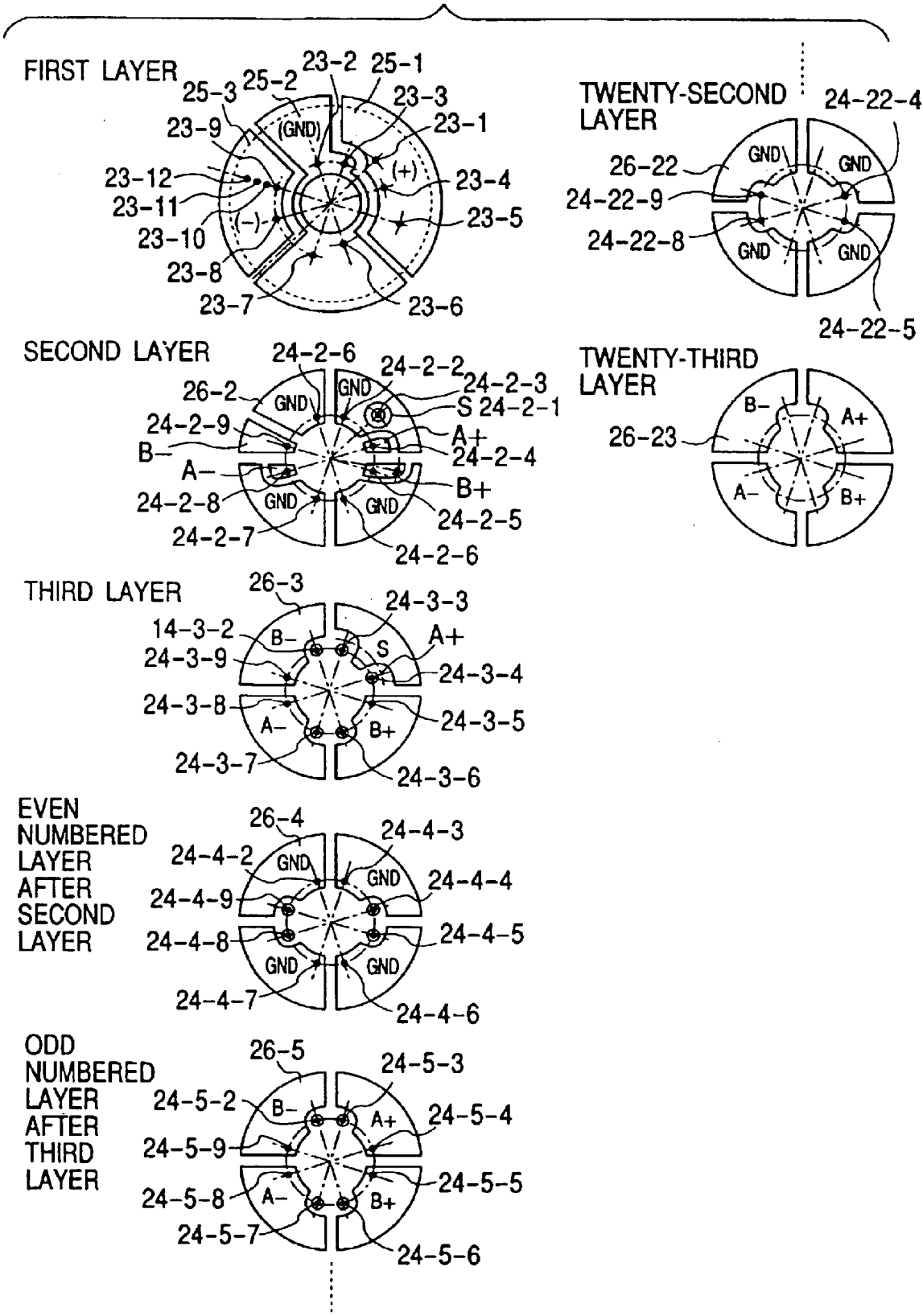
FIG. 11 is a plan view of the layers constituting the stacked piezoelectric element shown in FIG. 10.
Figure 13A:
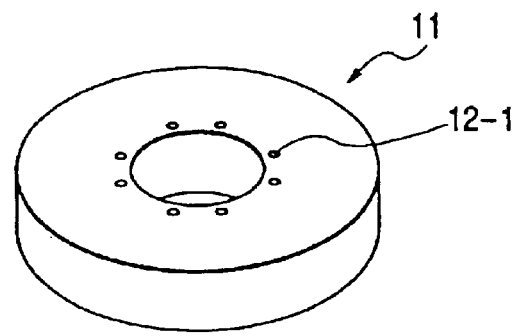
FIGS. 13A and 13B are views showing a conventional stacked piezoelectric element, respectively in a perspective view and in an exploded perspective view showing different layers.
Figure 13B:
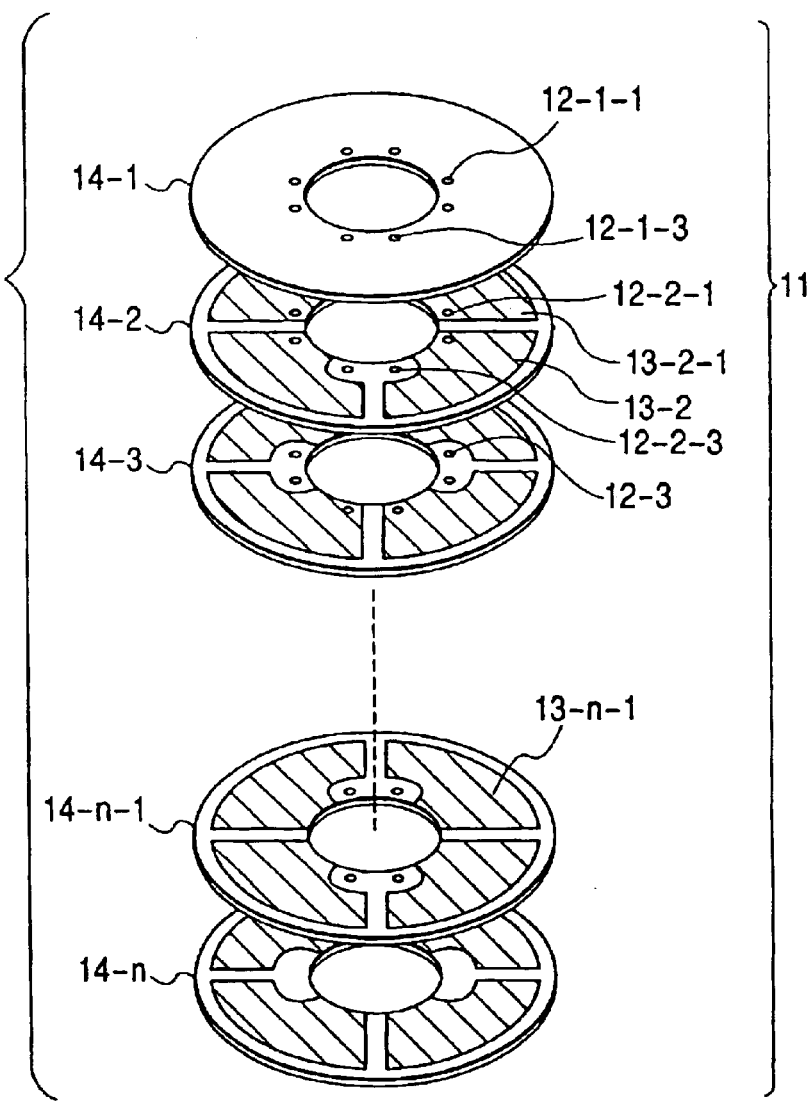

FIGS. 10 and 11 illustrate a fifth embodiment of the present invention.

FIG. 10 is an external view of the stacked piezoelectric element 1 at the polarization process. The stacked piezoelectric element 1 of the present embodiment for example has an outer diameter of 10 mm, an inner diameter of 2.8 mm and a thickness of about 2 mm.

FIG. 11 illustrates the surface electrode layer 25 (including electrodes 25-1 to 25-3) of the first piezoelectric of the stacked piezoelectric element 21 and the surface electrode layers 26 (26-2 to 26-23) of the second and subsequent piezoelectric layers, and the positions of the through holes (indicated by black circles) connecting these layers, including the through holes 23 (23-1 to 23-12) of the first layer and those 24 (24-2-1 to 9 . . . ) of the second and subsequent layers.

In the present embodiment, the first electrode layer has an outer diameter of 9.5 mm and an inner diameter of 2.8 mm, while the second to twenty-third electrode layers 26-2 to 26-23 have an outer diameter of 9 mm and an inner diameter of 3.4 mm.

The stacked piezoelectric element of the present embodiment is formed by utilizing green sheets (not shown) of a thickness of about 85 µm consisting of powdered piezoelectric ceramics and an organic binder, and the first electrode layer 25 and the second and subsequent electrode layers 26 are formed by screen printing electrode paste on the green sheets.

The through holes 23, 24 of a diameter of 0.1 mm are obtained by forming holes in the green sheet and filling the holes with the electrode paste by screen printing, in order to obtain electrical conduction between the electrode layers. The green sheets, the electrode layers and through holes are precisely superposed, then mutually adhered by hot pressing, and then sintered with a maximum temperature of 1120° C.

Among the through holes, the hole 12-1 formed in the first piezoelectric layer is connected to a sensor electrode S (for detecting the vibration state in case of application in a vibration motor) formed in the third electrode layer, while the linearly arranged through holes 23-10 to 23-12 are used for position confirmation, and the through hole 23-9 is aligned with these position confirming through holes and connected to the second electrode layer. Other through holes 23-2-23-9 are connected from the first electrode layer 25 to the twenty-second electrode layer 26-22 or the twenty-third electrode layer 26-23.

As shown in FIG. 10, the first electrode layers 25-1 to 25-3 directly receive the voltages of the polarizing DC power source 28 by the contact pins 22-1 to 22-3. The polarization process was executed by employing a DC power source 28 and applying a voltage of +180 V at the (+) side and −180 V at the (−) side with respect to the ground GND for 1 hour in silicone oil of 150° C.

Conventionally the first electrode layer 25, the second electrode layer 26-2 and the subsequent twenty-third electrode layer 26-23 are made as thin as possible, with an average thickness of 2 to 3 µm based on the currently available electrode paste and screen printing method.

FIGS. 12A and 12B show the cross section of the through holes along the stacking direction, respectively in the stacked piezoelectric element of the present embodiment shown in FIG. 11 and in the conventional stacked piezoelectric element, illustrating the first electrode layer 25, the through hole 23-4 therein, the through hole 24-2-4 of the second layer, the through hole 24-3-4 of the third layer, the through hole 24-4-4 of the fourth layer, the through hole 24-5-4 of the fifth layer, the through hole 24-22-4 of the twenty-second layer and the lowermost twenty-third electrode layer 26-23. The through hole 23-4 of the first layer and the through hole 24-2-4 of the second layer have different distances from the center of the element but the through holes of the second and subsequent layers have a same distance from the center of the element.

In the junctions between the electrode layers and the through holes of the stacked piezoelectric element of the present embodiment, there are provided thickness increasing electrode layers 27-3-4', 27-2-4, 27-2-4', 27-5-4, . . . , 27-23-4 in the vicinity of the through holes as shown in FIG. 12A, thereby increasing the thickness of the electrode layer around the through hole in comparison with the conventional configuration shown in FIG. 12B.

Also in the junction between the through holes of the second and third layers, a reinforcing electrode layer is provided on the surface of the third piezoelectric layer, around the through holes therein, so as not contact the electrodes formed on such surface, and similar reinforcing electrode layers 27-3-4, 27-4-4, 27-6-4 (not shown), . . . , 27-22-4 are formed.

As a result, the junctions between the electrodes of the electrode layers and the through holes and those between the through holes are mechanically and electrically reinforced by such reinforcing electrode layers.

In the conventional configuration shown in FIG. 12B, the junctions between the electrodes of the electrode layers and the through holes and those between the through holes may result in defective conduction because of the lack of such reinforcing electrode layers, but such defective conduction can be prevented in the present embodiment.

The above-described reinforcing electrode layer, particularly in case of formation on the electrode layer, has a thickness of 2 to 3 µm at minimum based on the currently available technologies as in the case of the electrode layers 25, 26, but is given a thickness of 4 to 6 µm in the present embodiment for achieving securer conduction.

The additional reinforcing electrode layer is formed by printing electrode paste after the formation of the electrode layer for voltage application or of the through hole.

The additional reinforcing electrode layer is desirably so shaped that the thickness gradually increases from the peripheral portion of the through hole to the through hole in consideration of the mechanical and electrical reinforcing, and can be easily formed by printing electrode paste with the ordinary screen printing method and stacking the green sheets by hot pressing.

The additional reinforcing electrode layers as shown in FIG. 12A realize securer conduction between the electrode layers and the through holes and between the through holes.

The level of conduction can be evaluated by measuring the electrostatic capacitance after the polarization process. The stacked piezoelectric element of the present embodiment has an electrostatic capacitance of 63 nF in average, with a variation of about ±2 nF.

On the other hand, the conventional stacked piezoelectric element has an electrostatic capacitance of 46 nF in average, with a variation as large as 0 to 64 nF, evidently indicating the presence of breakages.

FIG. 12A shows only a part of the through holes shown in FIG. 11, but reinforcing electrode layers similar to the reinforcing electrode layers 27-3-4', 27-2-4 are provided in the junction of other through holes and the electrode layers shown in FIG. 11 and similar to the reinforcing electrode layer 27-3-4 are provided in other junctions the through holes.

In the stacked piezoelectric element of the present embodiment, the piezoelectric layers have a thickness of 85 μm while the through holes have a diameter of 0.1 mm, the electrode layers 5, 6 have a thickness of 2 to 3 μm in average and the reinforcing electrode layers have a thickness of 4 to 6 μm. Although FIG. 12A illustrates the electrode layers in an exaggerated manner, the presence of the reinforcing electrode layers can be clearly confirmed by observing the cross section of the stacked piezoelectric element of the present embodiment.

The defective conduction between the electrode layers 25, 26 and the through holes or between the through holes is prone to occur particularly at the connecting portion between the end of the through hole and the electrode layer, and such defective conduction is caused not only by the polarization process but also by defective filling of the electrode paste into the through hole (particularly in the lower part of the through hole) or by defective hot pressing, in a stage where the element is completed for polarization, and the reinforcing electrode layers 27-2-4, 27-3-4 as shown in FIG. 12A are very effective for preventing such defective conduction.

The above-described stacked piezoelectric element can be applied as the vibration generating source constituting a vibration member in a vibration driving device such as a vibration motor, in which a traveling wave is generated by the synthesis of bending vibration in two directions, but the application is not limited to such object. It can also be utilized as the vibration generating source for other purposes with an appropriate change in the configuration of the electrode layers. It is for example sufficiently applicable to a stacked piezoelectric transducer.

As explained in the foregoing, the fifth embodiment reduces the defects caused in the polarization process, thereby improving the production yield of the stacked piezoelectric element, and enable the polarization process within a shorter time, without particular change in the polarizing power source, voltage condition thereof, or method or means for voltage elevation.

Also the producing method of the present invention for the stacked piezoelectric element allows to easily form a reinforcing electrode layer.

What is claimed is:

1. A method for producing a stacked piezoelectric element by alternately stacking a plurality of layers of an electrode material and piezoelectric layers having an electromechanical energy converting function and provided with penetrating electrodes, which are obtained by forming through holes in each piezoelectric layer and filling such through holes with the electrode material, to be connected at a contact portion with a layer of the electrode material and sintering the thus stacked layers, comprising a step of:

forming, on a first layer of the electrode material, a second layer of electrode material at a peripheral area of the contact portion between the first layer of the electrode material and the penetrating electrodes.

2. A method for producing a stacked piezoelectric element by alternately stacking a plurality of layers of an electrode material and piezoelectric layers having an electromechanical energy converting function and provided with penetrating electrodes, which are obtained by forming through holes in each piezoelectric layer and filling such through holes with the electrode material, to be connected at a contact portion with a layer of the electrode material and sintering the thus stacked layers, comprising a step of:

forming, on a first layer of the electrode material, a second layer of electrode material, at the contact portion on a connecting surface of the penetrating electrodes and at a peripheral portion thereof.

3. A method for producing a stacked piezoelectric element by alternately stacking a plurality of layers of an electrode material and piezoelectric layers having an electromechanical energy converting function and provided with penetrating electrodes, which are obtained by forming through holes in each piezoelectric layer and filling such through holes with the electrode material, to be connected at a contact portion with a layer of the electrode material and sintering the thus stacked layers, comprising a step of:

forming a second layer of electrode material which is thicker than a first layer of the electrode material on the piezoelectric layer at a peripheral portion of a contact area between two penetrating electrodes.

4. A method for producing a stacked piezoelectric element by alternately stacking a plurality of layers of an electrode material and piezoelectric layers having an electromechanical energy converting function and provided with penetrating electrodes, which are obtained by forming through holes in each piezoelectric layer and filling such through holes with the electrode material, to be connected at a contact portion with a layer of the electrode material and sintering the thus stacked layers, comprising a step of:

forming a second layer of electrode material which is thicker than a first layer of the electrode material at a peripheral area of the contact portion between the first layer of the electrode material and the penetrating electrodes.

* * * * *

UNITED STATES PATENT AND TRADEMARK OFFICE
CERTIFICATE OF CORRECTION

| | |
|---|---|
| PATENT NO. | : 6,951,048 B2 |
| APPLICATION NO. | : 10/700852 |
| DATED | : October 4, 2005 |
| INVENTOR(S) | : Yutaka Maruyama et al. |

It is certified that error appears in the above-identified patent and that said Letters Patent is hereby corrected as shown below:

[75] INVENTORS:

"Nobuyuki Kojima, Kanagawa-ken (JP);" should read --Nobuyuki Kojima, Yokohama (JP);-- and "Takahiro Yamakawa, Saitama-ken (JP)" should read --Takahiro Yamakawa, Konosu (JP)--.

COLUMN 2:

Line 35, "area a" should read --area α--.

COLUMN 9:

Line 59, "23-2-23-9 are" should read --23-2 to 23-9 are--.

COLUMN 11:

Line 15, "junctions" should read --junctions of--.

Signed and Sealed this

Twenty-second Day of August, 2006

JON W. DUDAS
*Director of the United States Patent and Trademark Office*